(12) United States Patent
Shi

(10) Patent No.: US 6,982,480 B2
(45) Date of Patent: Jan. 3, 2006

(54) NEAR HERMETIC PACKAGING OF GALLIUM ARSENIDE SEMICONDUCTOR DEVICES AND MANUFACTURING METHOD THEREFOR

(75) Inventor: Fong Shi, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 10/630,778

(22) Filed: Jul. 31, 2003

(65) Prior Publication Data

US 2005/0023558 A1   Feb. 3, 2005

(51) Int. Cl.
*H01L 23/22*   (2006.01)
*H01L 23/24*   (2006.01)

(52) U.S. Cl. .............. 257/687; 257/778; 257/787
(58) Field of Classification Search ............. 257/687, 257/330, 675, 709, 717, 778, 787
See application file for complete search history.

(56) References Cited

U.S. PATENT DOCUMENTS

| | | | | |
|---|---|---|---|---|
| 4,814,943 A | * | 3/1989 | Okuaki | 361/783 |
| 5,023,624 A | * | 6/1991 | Heckaman et al. | 343/860 |
| 5,396,403 A | * | 3/1995 | Patel | 361/705 |
| 5,572,070 A | * | 11/1996 | Ross | 257/713 |
| 5,945,734 A | * | 8/1999 | McKay | 257/687 |
| 6,249,136 B1 | * | 6/2001 | Maley | 324/765 |
| 6,462,405 B1 | * | 10/2002 | Lai et al. | 257/675 |
| 6,525,420 B2 | * | 2/2003 | Zuo et al. | 257/715 |
| 6,710,542 B2 | * | 3/2004 | Chun et al. | 313/506 |
| 2002/0153616 A1 | * | 10/2002 | Kunihisa et al. | 257/778 |
| 2003/0151133 A1 | * | 8/2003 | Kinayman et al. | 257/713 |

OTHER PUBLICATIONS

Peter P. Black and Donald E. Dunstone, "Development of Plastic Encapsulated Microcircuit Coating Processes Form Military Applications", Army RD&A, Jan.-Feb. 2000, pp. 8-11, Department of the Army.

* cited by examiner

*Primary Examiner*—Phat X. Cao
(74) *Attorney, Agent, or Firm*—Sonnenschein Nath & Rosenthal LLP

(57) ABSTRACT

A near-hermetic microwave semiconductor device, suitable for wideband high frequency applications including Phased Array Antenna systems, includes a PWB as a substrate; a GaAs Monolithic Microwave Integrated Circuit (MMIC) disposed on the substrate; a silicon carbide sealant disposed on the MMIC; and a Backside Interconnect with solder attachment which connects the substrate to the silicon carbide-coated MMIC. A conformal coating is disposed on the sealant, and a cover is disposed on the conformally-coated MMIC.

14 Claims, 1 Drawing Sheet

NEAR HERMETIC PACKAGING OF GALLIUM ARSENIDE SEMICONDUCTOR DEVICES AND MANUFACTURING METHOD THEREFOR

The present invention relates to a packaging solution for manufacturing advanced electronics systems using low-cost, near-hermetic packaging techniques for wide-bandwidth microwave applications using Monolithic Microwave Integrated Circuits (MMICs).

BACKGROUND OF THE INVENTION

Conventional communication antennas are mechanically bulky with complex steering systems that make mobile operations difficult. One solution to this problem is a Phased Array Antenna (PAA) which has been recognized as the preferred choice for high gains, with electronic beam-steering that is capable of maintaining a continuous link between mobile platforms.

The microwave modules of the PAA are the most critical component of the antenna, and it is the module design that determines the PAA performance and cost.

PAA transceiver modules employ multi-layer ceramic substrates for mounting MMICs and beam steering control Integrated Circuits (ICs). The ceramic substrate provides the necessary microwave signal paths between module and waveguide, as well as providing electrical circuit connections for power and control signals. The very same ceramic substrate also serves as the thermal path between the MMIC amplifiers and the module base plate where power amplifiers are employed.

However, MMIC (in this case, mostly gallium arsenide (GaAs) Integrated Circuits) performance degrades rapidly in the presence of moisture. Degradation can be observed through measurement of signal attenuation, RF loss, and parameter shift. In particular, condensation is a major concern if it occurs on the surface of the MMICs; it can lower device surface temperature and result in dendrite formation. For example, when gold is exposed to humidity under electrical field stress, dendrites can grow large enough to bridge insulation within just a few days.

Thus, hermeticity of the PAA transceiver modules is crucial to avoid degradation and losses. However, the packaging of the PAA transceiver modules to meet hermeticity requirements has resulted in cost drivers which have limited the application of PAA technology.

The current packaging approach involves placement of the semiconductor die in a hermetically sealed, customized, multi-layered, high cost, high-temperature co-fired ceramic package with thick film metallization. Aside from the inherent high material cost, this packaging configuration also requires manufacturing processes that do not lend themselves to low-cost, high volume processing. Further, due to the large number of hermetic PAA modules (each of the modules which are individually hermetically sealed and brazed to a metal can structure), there is a high cost involved.

Further, wide-bandwidth microwave electronics require the use of novel interconnect and packaging techniques; and thus, lightweight, wide-bandwidth PAA systems are needed to enable the space-based reconnaissance concepts of the future. For example, applications of wide-bandwidth PAA systems would include advanced airborne surveillance platforms that can be installed on various vehicles. These systems employ Electromagnetic Support Measures (ESM), broadband communications and advanced radar systems.

For narrow-band applications, MMICs and their control electronics often use bond wires. Since bond wires introduce extra inductance, they are actually serving the purpose of frequency tuning in narrow-band applications. However, obtaining precise wire length for a particularly turned frequency requires tight tolerance control during production.

Further, bond wires are not suitable for, for example, 2–18 GHz wideband applications. For wide-band applications, extra inductance of the bond wires degrades the RF performance.

Accordingly, due to the customized nature of the antenna module design and its tight tolerance requirement, the cost of a complete RF module can be very high. For example, for low volumes, 85% of the total package cost is associated with the high-temperature, co-fired ceramic package and its attachment to the metal header.

As an alternative and replacement to bond wires, die bumps are used in a die attachment known as the flip-chip method. However, the flip-chip method does not work well with MMICs that have been designed using conventional RF design and layout rules. Microwave structures such as micro-strips and strip-lines have unique RF characteristics depending on their spacing and the media above and ground plane below them. Currently, there are only a few design and layout tools to support flip-chip mounted microwave devices under development.

Accordingly, a commercial near-hermetic concept for the development of materials, packaging, and manufacturing technology used in wide-band RF systems (example, 2–18 GHz), which meets system requirements and can reduce component cost by more than 30%, is required.

SUMMARY OF THE INVENTION

The present invention relates to a packaging solution for manufacturing advanced electronics systems using low-cost, near-hermetic packaging techniques for wide-bandwidth microwave applications using GaAs Monolithic Microwave Integrated Circuits (MMICs).

In one embodiment consistent with the present invention, the near-hermetic microwave semiconductor device includes a substrate; a Monolithic Microwave Integrated Circuit (MMIC) disposed on the substrate; a silicon carbide sealant disposed on the MMIC; and a Backside Interconnect which connects the substrate to the silicon carbide-coated MMIC.

In another embodiment consistent with the present invention, the substrate is a PWB suitable for ultrahigh frequency applications, including Phased Array Antenna (PAA) systems.

In another embodiment consistent with the present invention, the substrate is formed of one of a liquid crystal polymer (LCP) and a ceramic.

In another embodiment consistent with the present invention, the silicon carbide is disposed over benzocyclobutene (BCB) as an interlayer dielectric, and forms a layer of approximately 4000 Angstroms in thickness.

In another embodiment consistent with the present invention, the Backside Interconnect includes plated-through ground vias disposed on the MMIC, which tie to terminals on the substrate.

In another embodiment consistent with the present invention, AuSn solder is used along a periphery of the MMIC, to attach and seal the MMIC to the substrate.

In another embodiment consistent with the present invention, a conformal coating is disposed on the silicon carbide sealant.

In another embodiment consistent with the present invention, a cover is disposed on the sealant-coated MMIC, or on the conformal-coated MMIC.

In another embodiment consistent with the present invention, a method of manufacturing a near-hermetic microwave semiconductor device, includes providing a PWB substrate; depositing a sealant on a Monolithic Microwave Integrated Circuit (MMIC); and using a Backside Interconnect to attach the sealant-coated MMIC to the substrate.

In one embodiment consistent with the present invention, the sealant is silicon carbide and the sealant is deposited to a thickness of approximately 4000 Angstroms.

In another embodiment consistent with the present invention, the method of manufacturing the near-hermetic microwave semiconductor device includes depositing the silicon carbide over benzocyclobutene (BCB) as an interlayer dielectric.

In another embodiment consistent with the present invention, the method of manufacturing the microwave semiconductor device includes disposing a conformal coating on the sealant, and disposing a cover on the conformal coating.

In another embodiment consistent with the present invention, the method of manufacturing the microwave semiconductor device includes soldering the MMIC to the substrate.

Thus has thus been outlined, some features consistent with the present invention in order that the detailed description thereof that follows may be better understood, and in order that the present contribution to the art may be better appreciated. There are, of course, additional features consistent with the present invention that will be described below and which will form the subject matter of the claims appended hereto.

In this respect, before explaining at least one embodiment consistent with the present invention in detail, it is to be understood that the invention is not limited in its application to the details of construction and to the arrangements of the components set forth in the following description or illustrated in the drawings. Methods and apparatuses consistent with the present invention are capable of other embodiments and of being practiced and carried out in various ways. Also, it is to be understood that the phraseology and terminology employed herein, as well as the abstract included below, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the methods and apparatuses consistent with the present invention.

BRIEF DESCRIPTION OF THE DRAWING

The FIGURE illustrates a schematic cross-sectional view of a microwave package consistent with one embodiment of the present invention.

DETAILED DESCRIPTION OF THE INVENTION

Figure 1:
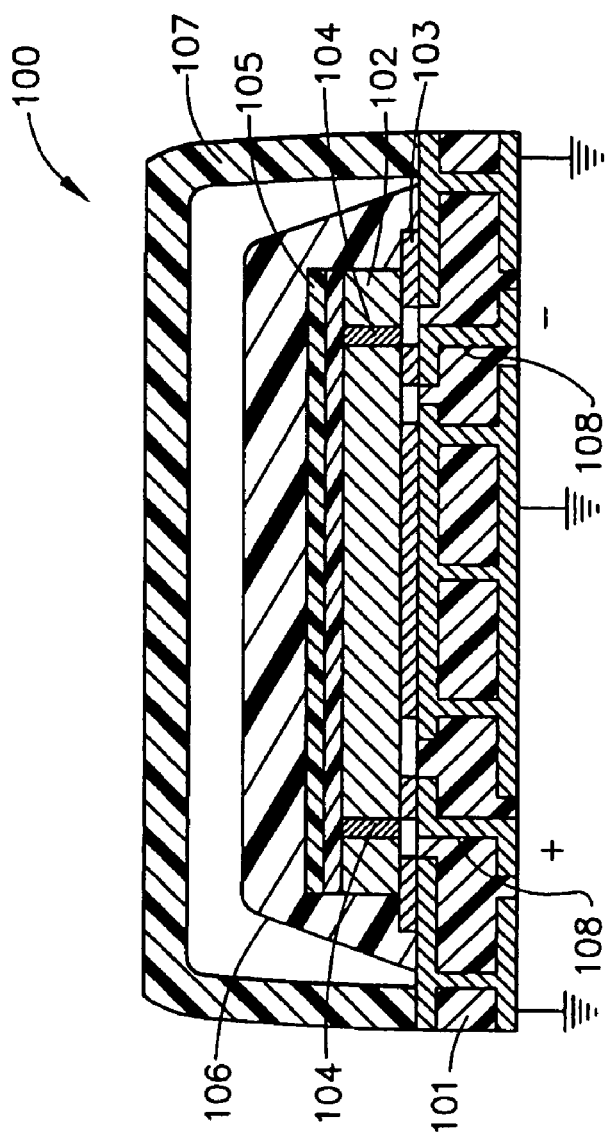

The present invention relates to a semiconductor packaging technique for achieving hermetically equivalent performance of the semiconductor package, and more particularly, to low-cost packaging alternatives to gallium arsenide (GaAs) microwave semiconductor devices in hermetically sealed ceramic or metal packages.

In particular, the present invention relates to Phased Array Antenna (PAA) systems involving a planar array of waveguide radiatiors with wide-scan capability, which can achieve near-hermetic performance. Connected to each radiator is an electronic module which includes several MMICs and a beam steering control Integrated Circuit (IC).

The FIGURE illustrates a schematic cross-sectional view of a microwave package 100 consistent with the present invention, showing the construction and layer build-up of one semiconductor package.

In one embodiment consistent with the present invention, a substrate 101 or Radio Frequency (RF) header, is an advanced, low-dielectric organic Printed Wiring Board (PWB) or carrier suitable for ultrahigh frequency applications such as PAA systems. Such PWB systems permit processing using conventional PWB fabrication methods which will lead to a cost reduction by, for example, a factor of seven compared to high-temperature co-fired ceramic technology.

In one embodiment consistent with the present invention, a Liquid Crystal Polymer (LCP) laminate materials for the PWB substrate 101 is used, which is a low-cost high frequency packaging material compared to existing expensive and customized ceramic RF packages. The low TCE LCP laminate materials have shown better RF and temperature performance in addition to excellent CTE matching (i.e., 8 ppm TCE of R/max—3700) with semiconductor devices, especially the GaAs MMICs.

However, in other embodiments consistent with the present invention, alternative materials for the substrate 101 can include Rogers materials and ceramics.

In one embodiment consistent with the present invention, a Silicon Carbide (SiC) sealant coating, or a SiC over Benzocyclobutene (BCB) (as an Interlayer Dielectric) sealant coating, (for example, Chip Seal™ made by Dow Corning) is disposed topside of the GaAs MMIC 102 to form a near-hermetic seal. The sealant used in the present invention is applied by a standard process technology, and is compatible with all current MCM interconnection approaches, including wire bond TAB, flip-chip, etc. The sealant may form a layer of approximately 4000 Angstroms on the MMIC 102, and is deposited directly on the passivation layers (0.5 $\mu$m/10 $\mu$m) on the topside of the MMIC 102. The near-hermetic passivation layers (0.5 $\mu$m/10 $\mu$m) on the topside of the MMIC 102 cover air bridges. The SiC coating will seal the microchips from inorganic and organic liquid and vapors.

In one embodiment consistent with the present invention, the MMIC 102, coated with the SiC/BCB sealant overcoat 105, is attached to the substrate 101 using a Backside Interconnection. If a MMIC 102 has a Backside electrical interconnect, there will be no need to flip the die for attachment. In the present invention, a Backside Interconnect, combined with the sealant and a non-flip die attachment method, is used.

For example, plated-through ground vias 104 for the Backside Interconnect are disposed in the GaAs MMIC 102, and tie to two terminals 108 on the RF header 101, and rest vias (not shown) tie to the bottom ground plane of the RF header 101.

For example, GaAs MMIC 102 includes a Backside Interconnect for wideband applications, including a near-hermetic seal along the MMIC's periphery by use of an AuSn solder 103 attachment after the GaAs MMIC 102 is solder-attached to the substrate 101.

With the use of a Backside Interconnect, bond wires, which introduce extra inductance that is undesirable for wide-bandwidth application, are eliminated. Furthermore, the use of a Backside Interconnect eliminates the difficulty in maintaining tolerance control of the bond wire length in production.

Thus, the Backside Interconnect approach reduces the overall module size by about 10–15% since the bond wires and associated bonding pads are eliminated. Therefore, for the same effective surface, module density can be increased proportionally, assembly cost is reduced, and wide bandwidth performance enhanced.

In addition, a number of wafer processing steps are eliminated from the sealant coating process. The Backside Interconnection eliminates the following otherwise required SiC coating processing steps:

spin-on of photo-resist over coated wafers;
re-opening the pads with pad masks;
removal of SiC coating over the pad areas;
deposition of TiW material;
deposition of Au over TiW materials to recap the pads; and
removal of remaining photoresist.

Thus, a simplified SiC/BCB coating process at wafer-level includes no pad opening, no TiW/Au deposition, and is reduced to a one-coat process over the entire wafer or MMIC, which will improve the yield and reduce the overall processing cost.

In one embodiment consistent with the present invention, a low dielectric conformal coating 106 with a dielectric constant suitable for operating at an operational frequency between 2 and 10 GHz, will seal the microchips from inorganic and organic liquid and vapors, for additional protection.

Thus, both a silicon carbide coating 105 and a conformal coating 106 are used to achieve hear-hermetic performance in the microwave package 100 of the present invention.

Finally, in one embodiment consistent with the present invention there is a non-metallic or metallized Liquid Crystal Polymer (LCP) cover 107, which may be attached with epoxy or solder and used to protect the device 100 from mechanical damage due to handling. The cover may be disposed on the conformal-coated MMIC.

Thus, instead of a PAA transceiver module being hermetically sealed in a can, a near-hermetic SiC/BCB coating 105 with LCP cover 107, and perhaps a conformal coating 106, is used on MMICs having advanced high frequency PWB materials, with a Backside Interconnect instead of a wire bonding process, and advanced Chip-On-Board packaging technology. With the elimination of the wire bonding process, smaller overall package size, suitable for wide-bandwidth microwave communication applications, and conventional microstrip topology, can be achieved. The modules are mass assembled on a panel instead of being individually assembled.

The estimated cost savings of such novel packages in materials and labor is at least 20–25% of the existing ceramic microwave package, and an additional cost saving of 20–25% in module assembly, due to the elimination of the wire bonding process.

It should be emphasized that the above-described embodiments of the invention are merely possible examples of implementations set forth for a clear understanding of the principles of the invention. Variations and modifications may be made to the above-described embodiments of the invention without departing from the spirit and principles of the invention. All such modifications and variations are intended to be included herein within the scope of the invention and protected by the following claims.

What is claimed is:

1. A near-hermetic microwave semiconductor device comprising:
 a substrate;
 a Monolithic Microwave Integrated Circuit (MMIC) disposed on said substrate;
 a sealant disposed on said MMIC and over benzocyclobutene (BCB) as an interlayer dielectric, said sealant comprising a layer of silicon carbide; and
 a backside interconnect extending between opposite faces of said MMIC and connecting said substrate to said sealant-coated MMIC.

2. The microwave semiconductor device according to claim 1, wherein said MMIC is a GaAs MMIC.

3. The microwave semiconductor device according to claim 1, further comprising a solder attachment along a periphery of said MMIC, to seal said MMIC to said substrate.

4. The microwave semiconductor device according to claim 1, further comprising a conformal coating disposed on said sealant.

5. The microwave semiconductor device according to claim 1, further comprising a cover disposed on said MMIC.

6. The microwave semiconductor device according to claim 1, wherein said backside interconnect includes plated-through vias disposed in said MMIC extending between opposite faces of said MMIC, and tying to terminals on said substrate.

7. The microwave semiconductor device according to claim 1, wherein the device is substantially free of bond wires and solder balls.

8. The microwave semiconductor device according to claim 1, further comprising a plurality of rest vias connecting the MMIC to a bottom ground plane of the substrate.

9. The microwave semiconductor device according to claim 3, wherein the said solder attachment is formed using AuSn solder.

10. The microwave semiconductor device according to claim 4, further comprising a cover disposed over said conformal-coated MMIC in a non-contacting manner.

11. The microwave semiconductor device according to claim 1, wherein the device is substantially free of solder balls and bond pads and said coating is a low dielectric having a dielectric constant suitable for operating at an operational frequency between about 2 GHz and about 10 GHz.

12. The microwave semiconductor device according to claim 1, wherein said substrate is a PWB suitable for ultrahigh frequency applications.

13. The microwave semiconductor device according to claim 12, wherein said ultrahigh frequency applications include Phased Array Antenna (PAA) systems.

14. The microwave semiconductor device according to claim 12, wherein said substrate is formed of one of a liquid crystal polymer (LCP) and a ceramic.

* * * * *